United States Patent
Torikawa et al.

(10) Patent No.: US 9,741,535 B2
(45) Date of Patent: Aug. 22, 2017

(54) CHARGED PARTICLE BEAM APPARATUS

(71) Applicant: HITACHI HIGH-TECH SCIENCE CORPORATION, Minato-ku, Tokyo (JP)

(72) Inventors: Shota Torikawa, Tokyo (JP); Tatsuya Asahata, Tokyo (JP); Atsushi Uemoto, Tokyo (JP); Makoto Sato, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/859,726

(22) Filed: Sep. 21, 2015

(65) Prior Publication Data
US 2016/0093467 A1 Mar. 31, 2016

(30) Foreign Application Priority Data
Sep. 26, 2014 (JP) .................................. 2014-195936

(51) Int. Cl.
*H01J 37/304* (2006.01)

(52) U.S. Cl.
CPC ..... *H01J 37/3045* (2013.01); *H01J 2237/317* (2013.01)

(58) Field of Classification Search
CPC .. H01J 37/00; H01J 37/4045; H01J 2237/317; H01J 37/3045
See application file for complete search history.

(56) References Cited

U.S. PATENT DOCUMENTS

| | | | | |
|---|---|---|---|---|
| 2009/0242759 A1* | 10/2009 | Bray | ................... | G01R 31/307 250/307 |
| 2010/0092070 A1* | 4/2010 | Young | ................... | G06T 7/0042 382/151 |
| 2013/0214458 A1 | 8/2013 | Suzuki | ......................... | 264/488 |
| 2014/0361165 A1* | 12/2014 | Sed'a | ..................... | H01J 37/12 250/307 |

FOREIGN PATENT DOCUMENTS

JP 2013170941 9/2013

* cited by examiner

*Primary Examiner* — Wyatt Stoffa
*Assistant Examiner* — Eliza Osenbaugh-Stewar
(74) *Attorney, Agent, or Firm* — Adams & Wilks

(57) ABSTRACT

A charged particle beam apparatus includes a stage for fixing a sample, a driving mechanism for driving the stage, a focused ion beam column, an electron beam column, a detector that detects a secondary charged particle emitted from the sample irradiated with a charged particle beam, a gas supplying device that supplies gas for forming a deposition film on a surface of the sample, and a control device that generates image data indicating the position distribution of the secondary charged particle detected by the detector. The control device irradiates the sample with the electron beam prior to irradiating the sample with a focused ion beam, recognizes an alignment mark provided in the sample in the image data by the electron beam, and performs positioning of an irradiation region of the sample using the alignment mark.

21 Claims, 6 Drawing Sheets

CHARGED PARTICLE BEAM APPARATUS

This application claims priority from Japanese Patent Application No. 2014-195936 filed on Sep. 26, 2014, the entire subject-matter of which is incorporated herein by reference.

TECHNICAL FIELD

The disclosure relates to a charged particle beam apparatus.

BACKGROUND

In the related art, when performing various processes by irradiating a sample with a charged particle beam, a device for adjusting a working frame in accordance with observation during processing is known (for example, see JP-2013-170941 A).

However, in the above-explained related-art device, if a magnification of the observation is increased in order to improve processing accuracy, irradiation density of the charged particle beam is increased and the sample may be damaged. Thus, it is preferable that the damage of the sample is suppressed and the processing accuracy is appropriately improved.

SUMMARY

Illustrative aspects of the disclosure provide a charged particle beam apparatus which can appropriately improve processing accuracy.

In order to achieve the object according to the solution of the problems described above, the invention employs the following aspects.

(1) According to one illustrative aspect of the invention, there may be provided a charged particle beam apparatus comprising: a stage for fixing a sample; a driving device configured to drive the stage; an ion beam column configured to irradiate the sample with an ion beam; an electron beam column configured to irradiate the sample with an electron beam; a detector configured to detect a secondary particle emitted from the sample irradiated with the ion beam or the electron beam; an image data generator configured to generate image data indicating the position distribution of the secondary particle detected by the detector; a gas supplying device configured to supply gas for forming a deposition film on a surface of the sample; and a control device configured to: control the electron beam column to irradiate the sample with the electron beam prior to irradiating the sample with the ion beam; recognize an alignment mark provided in the sample in the image data by the electron beam; and perform positioning of an irradiation region of the sample using the alignment mark.

According to the charged particle beam apparatus according to the aspect described in the above (1), positioning of the irradiation region is performed by irradiating with the electron beam prior to the irradiation with the ion beam and thereby it is possible to prevent damage of the sample due to irradiating with the ion beam. When obtaining the image data of a miniaturized sample, if the ion beam is applied, there is a concern that an analysis object such as the matching pattern is damaged by etching, but if the electron beam is applied, it is possible to obtain the image data without damage of the sample. The image of the alignment mark from the obtained image data is recognized and it is possible to accurately grasp a relative position of the irradiation region using the alignment mark and to accurately set the position of the grasped irradiation region at a processing position or at the center of the visual field.

(2) In the charged particle beam apparatus according to the above (1), wherein when irradiating the sample with the electron beam, the control device is configured to: drive the stage so as to be orthogonal to an optical axis of the electron beam column; recognize the alignment mark in the image data by the electron beam; and perform positioning of the irradiation region using the alignment mark, and wherein when irradiating the sample with the ion beam, the control device is configured to: drive the stage so as to be orthogonal to an optical axis of the ion beam column; recognize the alignment mark in the image data by the ion beam; and perform positioning of the irradiation region using the alignment mark.

In the case of the above (2), if each optical axis is orthogonal to the stage by driving of the stage when irradiating with each of the electron beam and the ion beam, since positioning of the irradiation region is performed individually using the alignment mark with each of the electron beam and the ion beam, it is possible to secure positioning accuracy independently from each other. Even if mechanical position deviation occurs with respect to each of the electron beam and the ion beam due to driving (for example, tilt driving) of the stage, it is possible to accurately set the position of the irradiation region at a target position such as the processing position or the center of the visual field irrespective of mutual positioning or the processing position.

(3) The charged particle beam apparatus according to the above (2), wherein when irradiating the sample with the electron beam, the control device, after performing positioning of the irradiation region using the alignment mark, is configured to: recognize a first matching pattern in the image data by the electron beam; and perform positioning of the irradiation region using the first matching pattern, and wherein when irradiating the stage with the ion beam, the control device, after performing positioning of the irradiation region using the alignment mark, is configured to: recognize a second matching pattern in the image data by the ion beam; and perform positioning of the irradiation region using the second matching pattern.

In the case of the above (3), local positioning by pattern matching is respectively and independently performed using the first and the second matching patterns in addition to positioning of the irradiation region using the alignment mark. Thus, it is possible to further improve the positioning accuracy.

(4) The charged particle beam apparatus according to the above (3), wherein the control device is configured to make the first matching pattern and the second matching pattern be the same pattern.

In the case of the above (4), pattern matching is individually performed when irradiating with the electron beam and the ion beam respectively. Thus, even if the mechanical position deviation occurs with respect to the same pattern due to driving (for example, tilt driving) of the stage, it is possible to ensure the positioning accuracy independently from each other.

(5) The charged particle beam apparatus according to any one of the above (2) to (4), wherein the control device is configured to perform each of positioning using the alignment mark in the image data by the electron beam and positioning using the alignment mark in the image data by the ion beam with respect to a plurality of the irradiation regions only once.

In the case of the above (5), if a plurality of processes (or a plurality of processing objects) are present with respect to each irradiation with the electron beam and the ion beam, it is possible to shorten an amount of time required for positioning by executing each of the plurality of processes together. First, the stage is driven so as to be disposed orthogonal to the optical axis of the electron beam when irradiating with the electron beam and positioning of the irradiation region of a process that is executed initially is performed using the alignment mark in the image data of the electron beam. Next, when executing each process for second and the following processes, the position of each irradiation region is set at the target position such as the processing position or the center of the visual field using known information regarding the relative position of each irradiation region with respect to the irradiation region of the initial process. After execution of the plurality of processes by the electron beam is completed, the stage is driven so as to be orthogonal to the optical axis of the ion beam and positioning of the irradiation region of the process that is initially executed is performed using the alignment mark in the image data of the ion beam. Next, when executing each process for second and the following processes, the position of each irradiation region is set at the target position such as the processing position or the center of the visual field using known information regarding the relative position of each irradiation region with respect to the irradiation region of the initial process. Thus, it is possible to shorten an entire operation time compared to a case where positioning is performed using driving of the stage and the alignment mark for each of the plurality of processes of the electron beam and the ion beam.

(6) The charged particle beam apparatus according to any one of the above (2) to (4), wherein the control device is configured to perform positioning using, the alignment mark in the image data by the electron beam and positioning using the alignment mark in the image data by the ion beam with respect to each of a plurality of the irradiation regions repeatedly.

In the case of the above (6), if the plurality of processes (or a plurality of processing objects) are present with respect to each irradiation with the electron beam and the ion beam, even if information of the relative position with respect to the irradiation regions of the processes from each other is not known, it is possible to accurately perform positioning. First, the stage is driven so as to be orthogonal to the optical axis of the electron beam when irradiating with the electron beam and positioning of the irradiation region of the process that is initially executed by the electron beam is performed using the alignment mark in the image data of the electron beam. Next, after execution of the process, the stage is driven so as to be orthogonal to the optical axis of the ion beam and positioning of the irradiation region of the process that is initially executed by the ion beam is performed using the alignment mark in the image data of the ion beam.

(7) The charged particle beam apparatus according to any one of the above (2) to (6), wherein the control device is configured to: set irradiation frames of the electron beam and the ion beam using the image data by the electron beam; and use the irradiation frames in each of a case where the sample is irradiated with the electron beam and a case where the sample is irradiated with the ion beam.

In the case of the above (7), positioning is processed using the alignment mark of the electron beam and the ion beam respectively. Thus, it is possible to register common processing information (template) including the irradiation frame of the electron beam and the ion beam using the image data by the electron beam. That is, in processing information (template) that is commonly used for the electron beam and the ion beam, position information with respect to each irradiation frame may be provided and it is possible to simplify a registering operation of the processing information.

(8) The charged particle beam apparatus according to the above (1), wherein when irradiating the sample with the electron beam, the control device is configured to: drive the stage so as to be orthogonal to an optical axis of the electron beam column; recognize the alignment mark in the image data by the electron beam; and perform positioning of the irradiation region using the alignment mark, and wherein when irradiating the sample with the ion beam, the control device is configured to: drive the stage so as to be orthogonal to an optical axis of the ion beam column; recognize a first matching pattern in the image data of a first magnification by the ion beam using offset information on position deviation of the irradiation region in accordance with driving of the stage when transition from a state of irradiating with the electron beam to a state of irradiating with the ion beam is performed, the first magnification being less than a predetermined magnification; and perform positioning of the irradiation region using the first matching pattern.

In the case of the above (8), positioning using the alignment mark in the image data by the ion beam is unnecessary by using offset information on the position deviation of the irradiation region due to driving of the stage. It is possible to simplify the positioning operation. It is possible to set the irradiation frame considering the position deviation of the irradiation region due to driving of the stage by keeping offset information in advance in the irradiation frame used for irradiation with the ion beam without having to use the alignment mark. Furthermore, in the image data of less than a predetermined magnification by the ion beam, it is possible to eliminate an error of offset information and to improve the positioning accuracy of the irradiation region by performing pattern matching.

(9) The charged particle beam apparatus according to the above (8), wherein when irradiating the sample with the ion beam, the control device, after performing positioning of the irradiation region using the first matching pattern, is configured to: recognize a second matching pattern, which is different from the first matching pattern, in the image data of a second magnification by the ion beam, the second magnification being equal to or more than the predetermined magnification; and perform positioning of the irradiation region using the second matching pattern.

In the case of the above (9), in the image data of the predetermined magnification or more by the ion beam, it is possible to improve local positioning accuracy by performing positioning of the irradiation region using another matching pattern (that is, matching pattern at higher magnification) different from a matching pattern of a low magnification less than the predetermined magnification.

(10) The charged particle beam apparatus according to the above (8), wherein when irradiating the sample with the ion beam, the control device, after performing positioning of the irradiation region using the first matching pattern, is configured to: recognize a plurality of other matching patterns different from the first matching pattern in each type of the image data of a plurality of different magnifications by the ion beam; and perform positioning of the irradiation region using each of the plurality of other matching patterns.

In the case of the above (10), in the image data of a plurality of different magnifications by the ion beam, it is possible to improve the positioning accuracy by performing positioning of the irradiation region using the plurality of different matching patterns different from the matching pattern of less than the predetermined magnification.

(11) The charged particle beam apparatus according to the above (10), wherein the control device is configured to perform positioning of the irradiation region using each of the plurality of other matching patterns while sequentially increasing the magnification of the image data of the plurality of different magnifications.

In the case of the above (11), it is possible to improve workability of pattern matching and to easily increase the positioning accuracy of the irradiation region by performing positioning of the irradiation region using the different matching pattern in each type of the image data while sequentially increasing the magnifications of a plurality of image data.

(12) The charged particle beam apparatus according to any one of the above (8) to (11), wherein after performing positioning of the irradiation region using the first matching pattern, the control device is configured to perform centering comprising positioning the irradiation region at a center of the visual field.

In the case of the above (12), whenever performing positioning by pattern matching, that is, grasping a relative positional relationship between the position of the irradiation region and the target position such as the processing position using the matching pattern, it is possible to improve the processing accuracy by irradiating with the ion beam by moving the position of the irradiation region to the center of the visual field by driving the stage.

(13) The charged particle beam apparatus according to the above (12), wherein when positioning the irradiation region at the center of the visual field, the control device is configured to drive the stage and perform beam shift of the ion beam.

In the case of the above (13), it is possible to perform positioning in micron order by driving of the stage. Furthermore, it is possible to perform positioning in nanometers by the beam shift of the ion beam and to improve the positioning accuracy.

(14) The charged particle beam apparatus according to any one of the above (8) to (13), wherein when irradiating the sample with the electron beam, the control device, after performing positioning of the irradiation region using the alignment mark, is configured to: recognize the matching patterns in the image data by the electron beam; and perform positioning of the irradiation region using the matching pattern.

In the case of the above (14), in positioning by the electron beam, after positioning of the irradiation region is performed using the alignment mark, it is possible to improve the positioning accuracy by performing positioning of the irradiation region using the matching pattern.

(15) The charged particle beam apparatus according to any one of the above (8) to (14), wherein the ion beam column comprises a plasma type ion source. In the case of the above (15), even if the resolution of the ion beam is low compared to another ion beam column such as an ion beam column including a plasma type ion source, it is possible to ensure a desired accuracy by positioning using the alignment mark by the electron beam. That is, even if positioning using the alignment mark by the ion beam is difficult, it is possible to accurately perform positioning using the alignment mark by the electron beam.

(16) The charged particle beam apparatus according to any one of the above (8) to (15), wherein the control device is configured to form the deposition film in the irradiation region by irradiating the irradiation region with the electron beam while supplying the gas to the irradiation region prior to irradiating the irradiation region with the ion beam.

In the case of the above (16), it is possible to protect the irradiation region in advance by forming the deposition film in the irradiation region by irradiating with the electron beam prior to irradiating the irradiation region with the ion beam.

(17) The charged particle beam apparatus according to the above (16), wherein the control device is configured to: form the deposition film in a predetermined region by irradiating the predetermined region with the electron beam while supplying the gas to the predetermined region other than the irradiation region; and make a region including the deposition film formed in the predetermined region be a reference mark or a matching pattern, and wherein in each of a case where the irradiation region is irradiated with the electron beam and a case where the irradiation region is irradiated with the ion beam, the control device is configured to: recognize the reference mark or the matching pattern in the image data by each of the electron beam and the ion beam; and perform positioning of the irradiation region using the reference mark or the matching pattern.

In the case of the above (17), the relative positional relationship of the deposition film with respect to the irradiation region is grasped by forming the deposition film as the reference mark or the matching pattern in the predetermined region other than the irradiation region. Thus, even after the irradiation region is protected by another deposition film, it is possible to accurately perform positioning using the deposition film.

(18) The charged particle beam apparatus according to the above (17), wherein the control device is configured to complete formation of the deposition film within a predetermined time when forming the deposition film in the predetermined region.

In the case of the above (18), it is possible to desirably ensure the positioning accuracy by making a time when forming the deposition film that is the reference mark or the matching pattern by irradiating with the electron beam be within a predetermined time in which drift of the electron beam is negligible.

(19) The charged particle beam apparatus according to the above (17) or (18), wherein the control device is configured to make a shape of the deposition film formed in the predetermined region be a shape extending on an extension line of a cross section formed by processing the ion beam.

In the case of the above (19), it is possible to accurately perform positioning with respect to a direction parallel to a cross section using the deposition film that is the reference mark or the matching pattern.

(20) The charged particle beam apparatus according to the above (16), wherein the control device is configured to make a region including the irradiation region be the matching pattern, and wherein in each of a case where the irradiation region is irradiated with the electron beam and a case where the irradiation region is irradiated with the ion beam, the control device is configured to: recognize the matching pattern in the image data by each of the electron beam and the ion beam; and perform positioning of the irradiation region using the matching pattern.

In the case of the above (20), if the region including the irradiation region is the matching pattern that is common in each of the electron beam and the ion beam, even if the deposition film is formed in the irradiation region by irradiating with the electron beam, it is possible to ensure a desired matching accuracy with respect to the ion beam.

Thus, it is possible to improve operation efficiency compared to a case where a new matching pattern is used when irradiating with the ion beam.

(21) The charged particle beam apparatus according to the above (16), wherein the control device is configured to: recognize a target object in the image data on an inside of the sample by the electron beam; and form the deposition film on the surface of the sample using the target object.

In the case of the above (21), the region including the deposition film is matching patterned by forming the deposition film on the surface of the sample using the target object on the inside of the sample. Thus, it is possible to accurately perform positioning. If an appropriate pattern is not present on the surface of the sample, even if desired position accuracy cannot be ensured in the pattern of the surface of the sample, and the like, it is possible to ensure a desired accuracy of pattern matching.

(22) The charged particle beam apparatus according to any one of the above (16) to (21), wherein the control device is configured to notify switching to a manual mode when it is unable to recognize the target object in the image data by the electron beam automatically.

In the case of the above (22), it is possible to form the deposition film on the surface of the sample by performing switching to a manual mode and even if the target object cannot be automatically recognized, it is possible to accurately perform positioning using the matching pattern.

According to the charged particle beam apparatus of the invention, it is possible to reduce the damage of the sample by irradiating with the ion beam in setting of the irradiation position and to perform the ion beam processing.

DETAILED DESCRIPTION

Hereinafter, a charged particle beam apparatus according to illustrative embodiments of the invention will be described with reference to the drawings.

First Illustrative Embodiment

Figure 1:
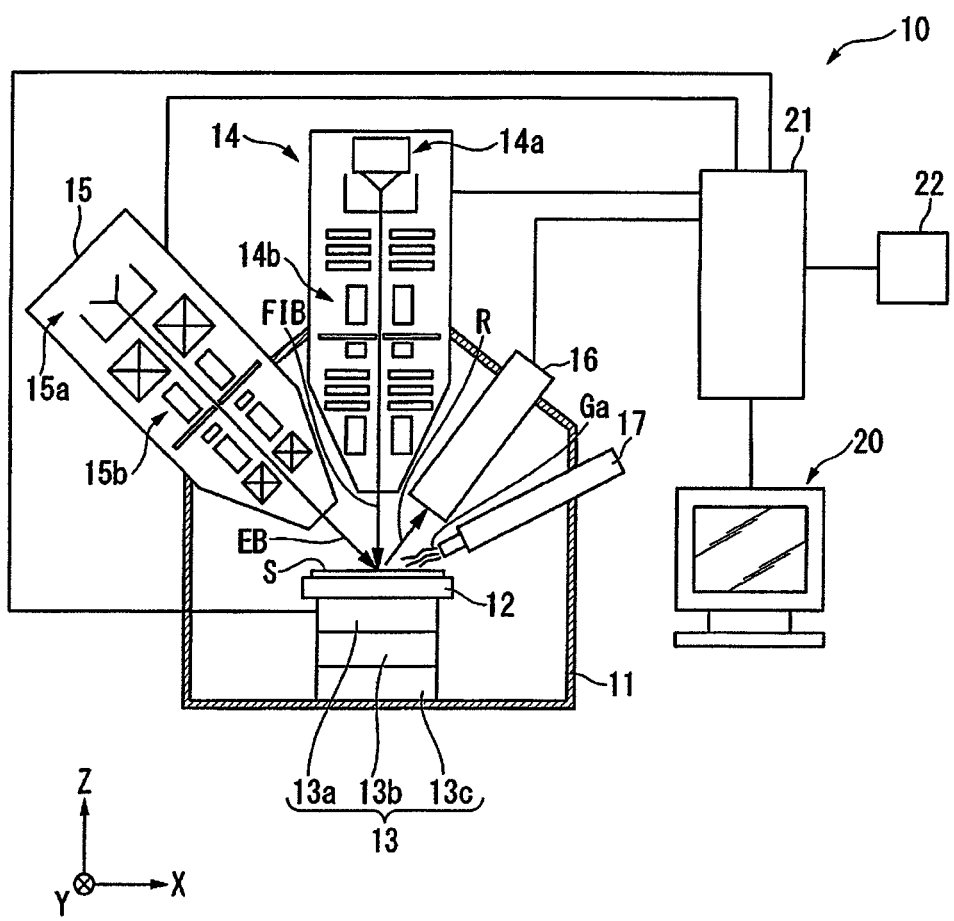
FIG. 1 is a configuration view of a charged particle beam apparatus according to a first illustrative embodiment of the invention.

As illustrated in FIG. 1, a charged particle beam apparatus 10 according to a first illustrative embodiment includes a sample chamber 11 of which an inside can be maintained in a vacuum state, a stage 12 that is capable of fixing a sample S on the inside of the sample chamber 11, and a driving mechanism 13 that drives the stage 12. The charged particle beam apparatus 10 includes a focused ion beam column 14 irradiating an irradiation object within a predetermined irradiation region (that is, scanning range) on the inside of the sample chamber 11 with a focused ion beam (FIB). The charged particle beam apparatus 10 includes an electron beam column 15 irradiating the irradiation object within the predetermined irradiation region on the inside of the sample chamber 11 with an electron beam (EB). The charged particle beam apparatus 10 includes a detector 16 that detects a secondary charged particle (secondary electron, secondary ion, and the like) R generated from the irradiation object by irradiating with the focused ion beam or electron beam. Furthermore, the charged particle beam apparatus 10 includes a detector (not illustrated) that detects a secondary charged particle (reflecting electron) generated from the irradiation object by irradiating with the electron beam on the inside of the electron beam column 15. The charged particle beam apparatus 10 includes a gas supplying device 17 for supplying gas Ga to the surface of the irradiation object. The charged particle beam apparatus 10 includes a display device 20 that displays image data and the like based on the secondary charged particle detected by the detector 16, a control device 21, and an input device 22.

The charged particle beam apparatus 10 can execute various processes (etching processing and the like) by sputtering and formation of a deposition film by irradiating a surface of the irradiation object with the focused ion beam while scanning the surface with the focused ion beam. The charged particle beam apparatus 10 can execute a processing of forming a cross section on the sample S for observing the cross section by a scanning electron microscope and the like, a processing of forming a sample piece (for example, a thin sample, a needle-like sample, and the like) for observing transmission from the sample S by a transmission electron microscope, and the like. The charged particle beam apparatus 10 can execute observation of the surface of the irradiation object by irradiating the surface of the irradiation object such as the sample S with the focused ion beam or the electron beam while scanning the surface with the focused ion beam or the electron beam.

The sample chamber 11 is configured such that an inside thereof can be evacuated until the inside becomes a desired vacuum state and can maintain the desired vacuum state by an evacuation device (not illustrated).

The stage 12 holds the sample S.

The driving mechanism 13 is housed on the inside of the sample chamber 11 in a state of being connected to the stage 12 and displaces the stage 12 with respect to a predetermined axis according to a control signal output from the control device 21. The driving mechanism 13 includes a moving mechanism 13a that moves the stage 12 parallel to an X axis and a Y axis that are parallel to a horizontal surface and orthogonal to each other, and a Z axis in a vertical direction orthogonal to the X axis and the Y axis. The driving mechanism 13 includes a tilt mechanism 13b that rotates the stage 12 around the X axis or the Y axis and a rotation mechanism 13c that rotates the stage 12 around the Z axis.

The focused ion beam column 14 is fixed to the sample chamber 11 such that a beam emitting device (not illustrated) on the inside of the sample chamber 11 faces the stage 12 at a position above the stage 12 within the irradiation region in the vertical direction and an optical axis thereof is parallel to the vertical direction. Thus, it is possible to irradiate the irradiation object such as the sample S fixed to the stage 12 with the focused ion beam from an upper side to a lower side in the vertical direction.

The focused ion beam column 14 includes an ion source 14a that generates the ions and an ion optical system 14b that focuses and deflects the ions extracted from the ion source 14a. The ion source 14a and the ion optical system 14b are controlled depending on a control signal output from the control device 21 and an irradiation position, an irradiation condition, and the like of the focused ion beam are controlled by the control device 21. For example, the ion source 14a is a liquid metal ion source using liquid gallium and the like, a plasma type ion source, a gas electric field ionized type ion source, and the like. For example, the ion optical system 14b includes a first electrostatic lens such as a condenser lens, an electrostatic deflector, and a second electrostatic lens such as an objective lens.

The electron beam column 15 is fixed to the sample chamber 11 such that the beam emitting device (not illustrated) on the inside of the sample chamber 11 faces the stage 12 in an inclined direction that is inclined at a predetermined angle with respect to the vertical direction of the stage 12 within the irradiation region and the optical axis is parallel to the inclined direction. Thus, the irradiation object such as the sample S fixed to the stage 12 can be irradiated with the electron beam from the upper side to the lower side in the inclined direction.

The electron beam column 15 includes an electron source 15a that generates electrons and an electron optical system 15b that focuses and deflects electrons emitted from the electron source 15a. The electron source 15a and the electron optical system 15b are controlled depending on a control signal output from the control device 21 and the irradiation position, the irradiation condition, and the like of the electron beam are controlled by the control device 21. For example, the electron optical system 15b includes an electromagnetic lens, a deflector, and the like.

Incidentally, arrangement of the electron beam column 15 and the focused ion beam column 14 is switched and then the electron beam column 15 may be disposed in the vertical direction and the focused ion beam column 14 may be disposed in the inclined direction that is inclined at the predetermined angle with respect to the vertical direction.

The detector 16 detects the intensity (that is, amount of the secondary charged particle) of the secondary charged particle (secondary electron, secondary ion, and the like) R emitted from the irradiation object when irradiating the irradiation object such as the sample S with the focused ion beam or the electron beam and outputs information of a detection amount of the secondary charged particle R. The detector 16 is disposed at a position in which the amount of the secondary charged particle R can be detected on the inside of the sample chamber 11, for example, at a position on the upper side inclined with respect to the irradiation object such as the sample S within the irradiation region, and the like, and is fixed to the sample chamber 11.

The gas supplying device 17 is fixed to the sample chamber 11 by facing a gas injection device (not illustrated) to the stage 12 on the inside of the sample chamber 11. The gas supplying device 17 can supply gas for etching for selectively promoting etching of the sample S by the focused ion beam depending on a material of the sample S, gas for deposition for forming the deposition film on the surface of the sample S by deposited matter such as metal or an insulator, and the like to the sample S. For example, etching is selectively promoted by supplying xenon fluoride with respect to a Si-based sample S, water with respect to an organic-based sample S, and gas for etching to the sample S together with irradiation with the focused ion beam. Furthermore, for example, a solid component that is decomposed from deposition gas is deposited on the surface of the sample S by supplying deposition gas of compound gas containing phenanthrene, platinum, carbon, tungsten, and the like together with irradiation with the focused ion beam.

The control device 21 is disposed on the outside of the sample chamber 11 and is connected to the display device 20 and the input device 22 such as a mouse and a keyboard outputting a signal depending on an input operation of an operator.

The control device 21 controls an operation of the charged particle beam apparatus 10 in an integrated manner by a signal output from the input device 22, a signal generated by an automatic driving control process that is set in advance, and the like.

The control device 21 generates the image data indicating a shape of the irradiation object by a two-dimensional position distribution of a detection amount of the secondary charged particle by converting the detection amount of the secondary charged particle detected by the detector 16 while scanning the irradiation position with the charged particle beam into a brightness signal corresponding to the irradiation position. The control device 21 displays a screen for executing an operation such as expansion, reduction, movement, rotation, and the like of each piece of image data on the display device 20 together with each generated piece of image data. The control device 21 displays a screen for performing various settings such as processing setting on the display device 20.

The charged particle beam apparatus 10 according to the first illustrative embodiment of the invention includes the configuration described above and, next, an operation of the charged particle beam apparatus 10 will be described.

Figure 2:
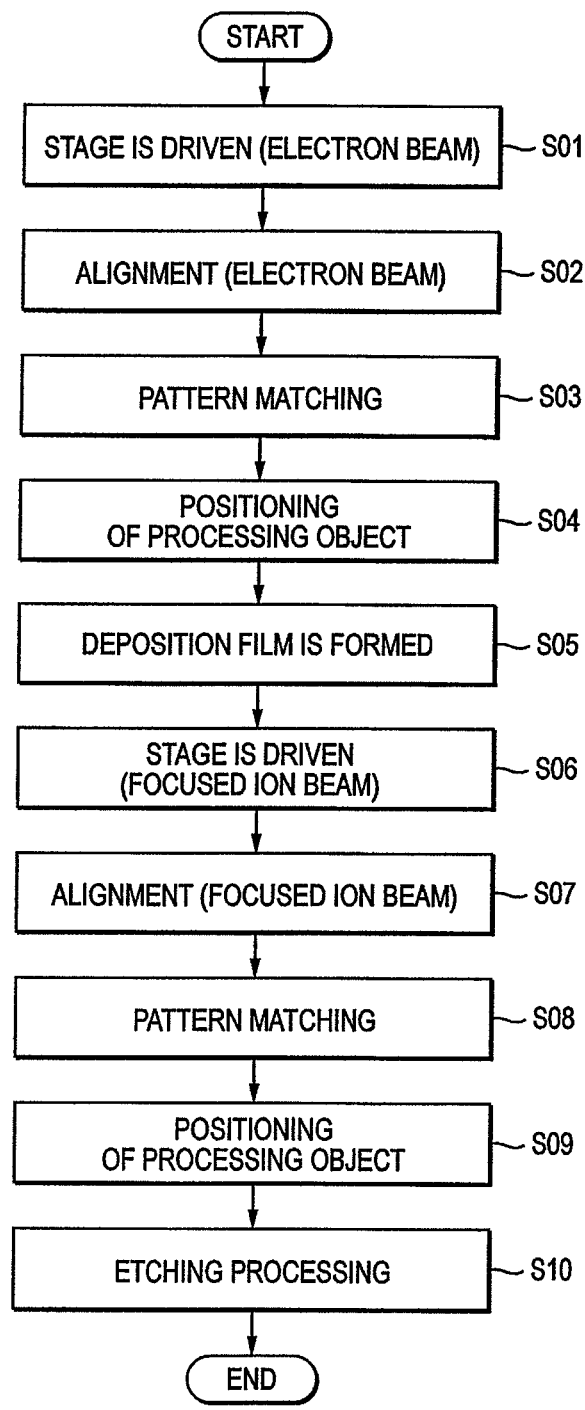
FIG. 2 is a flowchart illustrating an operation of the charged particle beam apparatus according to the first illustrative embodiment of the invention.
Figure 3:
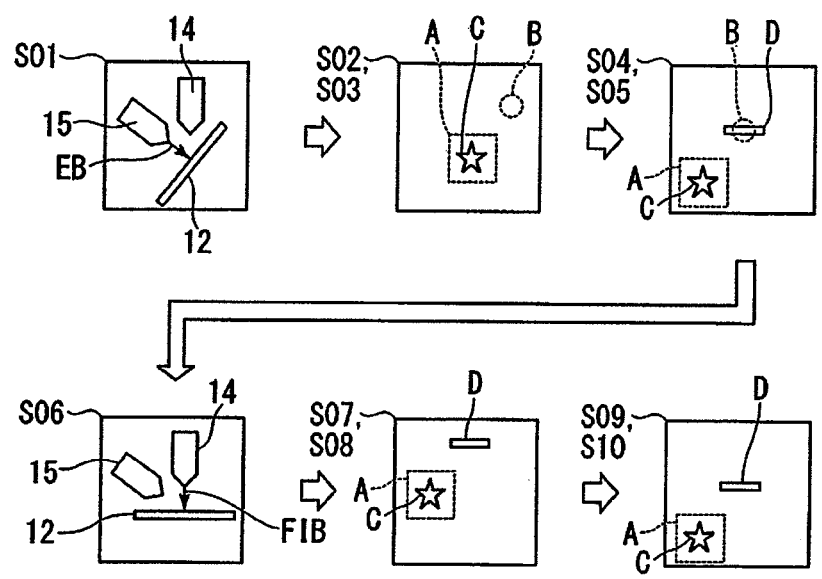
FIG. 3 is a diagram illustrating a flow of the operation of the charged particle beam apparatus according to the first illustrative embodiment of the invention.

The control device 21 performs irradiation with the electron beam prior to performing various processes on the sample S by irradiating with the focused ion beam. Thus, as illustrated in FIGS. 2 and 3, first, the control device 21 drives the stage 12 to be tilted by the tilt mechanism 13b of the driving mechanism 13 (step S01). The control device 21 sets the surface (that is, surface of the sample S) of the stage 12 to be orthogonal to the optical axis of the electron beam column 15 by rotating the stage 12 around the X axis or the Y axis by the tilt mechanism 13b.

Next, the control device 21 performs positioning of the irradiation region using the alignment mark present on the surface of the sample S (step S02). The control device 21 obtains the image data indicating the position distribution of the secondary charged particle emitted from the sample S by irradiating the sample S on the stage 12 with the electron beam while scanning the irradiation position. The control device 21 recognizes an image of the alignment mark present on the surface of the sample S using the obtained image data and performs positioning of the irradiation region using the recognized alignment mark. The control device 21 may use a mark such as an appropriate hole formed in advance on the surface of the sample S by irradiating with the focused ion beam or the electron beam, or may use an appropriate mark and the like present on the surface of the sample S as the alignment mark.

Next, the control device 21 recognizes the position of the processing object by performing pattern matching in the image data (step S03). The control device 21 performs pattern matching using a matching pattern A that is set in advance in the image data generated by irradiating with the electron beam with respect to the sample S. The control device 21 recognizes a position of a processing object B using a relative positional relationship between the matching pattern A and the processing object B that is known. The control device 21 sets the matching pattern A in a region including, for example, a predetermined reference mark C and the like.

Next, the control device 21 performs positioning of the irradiation region by moving the position of the processing object B to the center of the visual field to set a processing frame (irradiation frame) for forming the deposition film at a predetermined processing position (for example, the center (the center of the visual field) of a region of the visual field and the like) (step S04). The control device 21 moves the position of the processing object B to the center of the visual field by driving the stage 12 by the driving mechanism 13 and deflecting the electron beam by the electron optical system 15b of the electron beam column 15. Otherwise, if the position of the processing object B is moved to the center of the visual field by deflection of the electron beam by the electron optical system 15b of the electron beam column 15 without driving the stage 12, since influence of drift due to driving of the stage is not received, it is more preferable.

Next, the control device 21 sets a predetermined irradiation frame for forming the deposition film at the center of the visual field and forms a deposition film D by supplying gas by the gas supplying device 17 while irradiating the irradiation frame with the electron beam (step S05).

Next, the control device 21 drives the stage 12 to be tilted by the tilt mechanism 13b of the driving mechanism 13 (step S06). The control device 21 sets the surface (that is, the surface of the sample S) of the stage 12 to be orthogonal to the optical axis of the focused ion beam column 14 by rotating the stage 12 around the X axis or the Y axis by the tilt mechanism 13b.

Next, the control device 21 performs positioning of the irradiation region using the alignment mark present on the surface of the sample S (step S07). The control device 21 obtains the image data indicating the position distribution of the secondary charged particle R emitted from the sample S by irradiating the sample S on the stage 12 with the focused ion beam while scanning the irradiation position. The control device 21 recognizes the image of the alignment mark present on the surface of the sample S using the obtained image data and performs positioning of the irradiation region using the recognized alignment mark. The control device 21 uses, for example, the same alignment mark as that of step S02 described above as the alignment mark.

Next, the control device 21 recognizes the position of the processing object by performing pattern matching in the image data (step S08). For example, in the image data generated by irradiating the sample S with the focused ion beam, the control device 21 performs pattern matching using the same matching pattern A as that of step S03 described above. The control device 21 recognizes the position of the processing object B on which the deposition film D is formed using the relative positional relationship between the matching pattern A and the processing object B that is known. Thus, it is possible to specify the position of the processing object B even on the surface of the sample S on which the deposition film D is formed.

Next, the control device 21 performs positioning of the irradiation region by moving the position of the processing object B on which the deposition film D is formed to the center of the visual field to set the processing frame (irradiation frame) for etching processing at a predetermined processing position (for example, the center of the visual field and the like) (step S09). Here, if the printing irradiation region is set at the center of the visual field, since processing can be performed at a position in which position deviation is small by the magnification of beam scanning, it is preferable. The control device 21 moves the position of the processing object B to the center of the visual field by driving the stage 12 by the driving mechanism 13 and deflecting the focused ion beam by the ion optical system 14b of the focused ion beam column 14. Otherwise, if the position of the processing object B is moved to the center of the visual field by deflection of the focused ion beam by the ion optical system 14b of the focused ion beam column 14 without driving the stage 12, since influence of drift due to driving of the stage is not received, it is more preferable.

Next, the control device 21 sets a predetermined irradiation frame for etching processing at the center of the visual field and performs a predetermined etching processing by irradiating the irradiation frame with the focused ion beam (step S10). Then, the control device 21 completes a series of processes.

As described above, according to the charged particle beam apparatus 10 of the first illustrative embodiment of the invention, positioning of the irradiation region is performed by irradiating with the electron beam prior to irradiating with the focused ion beam. Thus, it is possible to prevent damage of the sample S by irradiating with the focused ion beam. When obtaining the image data of a miniaturized sample S, an image data obtaining region is irradiated with the focused ion beam with high density to observe the region with high magnification. Thus, there is a concern that the analysis object such as a matching pattern is damaged by etching, however, if the electron beam is emitted, it is possible to obtain the image data without damage in the sample S. The alignment mark is recognized from the image data generated by irradiating with the electron beam, and it is possible to accurately grasp the relative position of the irradiation region using the alignment mark, and to accurately set the position of the grasped irradiation region to the processing position (or the center of the visual field).

Furthermore, if each optical axis is orthogonal to the stage 12 by driving of the stage 12 when irradiating with the electron beam and the focused ion beam, positioning of the irradiation region is performed using each alignment mark individually with the electron beam and the focused ion beam. Thus, it is possible to accurately ensure positioning independently from each other. Even if the mechanical position deviation occurs with respect to each of the electron beam and the focused ion beam due to driving (for example, tilt driving) of the stage 12, it is possible to accurately set the position of the irradiation region to the target position such as the processing position (or the center of the visual field) irrespective of mutual positioning or the processing position.

Furthermore, for local positioning by pattern matching in addition to positioning of the irradiation region using the alignment mark, local positioning is performed independently using the first and second matching patterns with each of the electron beam and the focused ion beam. Thus, it is possible to further improve the positioning accuracy.

Furthermore, pattern matching is individually performed when irradiating with each of the electron beam and the focused ion beam. Thus, even if the mechanical position deviation occurs with respect to the same matching pattern due to driving (for example, tilt driving) of the stage 12, it is possible to ensure a desired positioning accuracy independently from each other.

In addition, the deposition film is formed in the irradiation region by irradiating with the electron beam prior to irradiating the processing object of the irradiation region with the focused ion beam. Thus, it is possible to protect the processing object of the irradiation region in advance.

Hereinafter, a first modification example of the first illustrative embodiment described above will be described.

In the first illustrative embodiment described above, if a plurality of processing objects are present, the control device 21 may execute the operations in step S06 and the following steps after the operations of step S01 to step S05 are executed with respect to one of the plurality of processing objects. In this case, the control device 21 repeatedly performs positioning using the alignment mark in the image data by the electron beam and positioning using the alignment mark in the image data by the focused ion beam on each of the plurality of processing objects. Thus, even if the information of the relative position with respect to the irradiation regions of processes of each other is not known, the control device 21 can accurately perform positioning.

Furthermore, the control device 21 may execute the operations in step S06 and the following steps after the operations of step S01 to step S05 described above are executed with respect to an entirety of the plurality of processing objects. In this case, the control device 21 performs each of positioning using the alignment mark in the image data by the electron beam and positioning using the alignment mark in the image data by the focused ion beam only once. Thus, the control device 21 can shorten an entire operation time compared to a case where driving of the stage 12 and positioning are performed for each of the plurality of processes of the electron beam and the focused ion beam.

Hereinafter, a second modification example of the first illustrative embodiment described above will be described.

In the first illustrative embodiment described above, the control device 21 uses the same matching pattern A in each piece of image data of the electron beam and the focused ion beam, but the invention is not limited to the illustrative embodiment.

The control device 21 may perform pattern matching using a different matching pattern in each piece of image data of the electron beam and the focused ion beam.

Hereinafter, a third modification example of the first illustrative embodiment described above will be described.

In the first illustrative embodiment described above, the control device 21 sets different irradiation frames (irradiation frame for forming the deposition film and the irradiation frame for etching processing) in each piece of image data of the electron beam and the focused ion beam, but the invention is not limited to the illustrative embodiment.

The control device 21 sets a common irradiation frame with the electron beam and the focused ion beam using the image data by the electron beam and may use the same irradiation frame in each of a case where the sample S is irradiated with the electron beam and a case where the sample S is irradiated with the focused ion beam. The control device 21 sets the irradiation frame for the deposition film formation by irradiating with the electron beam using the image data by the electron beam and sets the irradiation frame for etching processing by irradiating with the focused ion beam to be overlapped, and thereby sets the common irradiation frame.

Thus, the control device 21 performs positioning using the alignment mark with each of the electron beam and the focused ion beam. Thus, it is possible to register the common processing information (template) including the irradiation frame of each of the electron beam and the focused ion beam using the image data by the electron beam. That is, in the processing information (template) commonly used with respect to the electron beam and the focused ion beam, position information may be provided with respect to each irradiation frame and it is possible to simplify the registering operation of the processing information.

Second Illustrative Embodiment

A charged particle beam apparatus 10 according to a second illustrative embodiment has the same configurations as those of the charged particle beam apparatus 10 according to the first illustrative embodiment. Hereinafter, an operation of the charged particle beam apparatus 10 of the second illustrative embodiment will be described.

Figure 4:
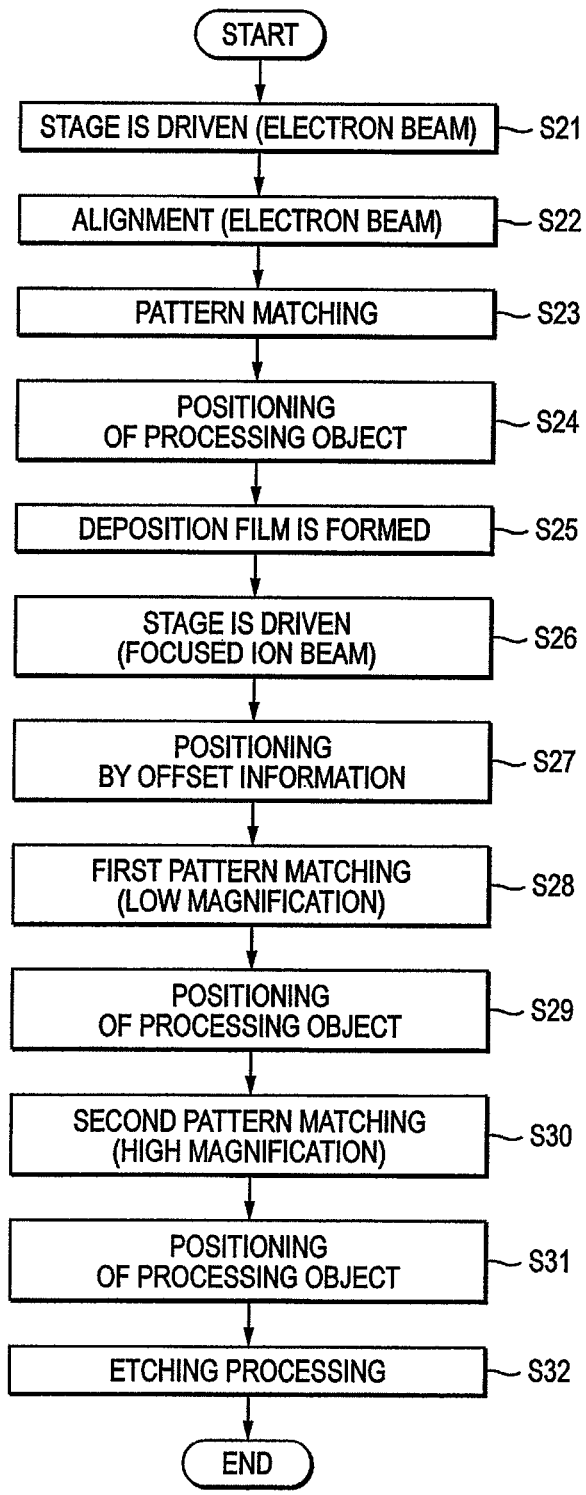
FIG. 4 is a flowchart illustrating an operation of a charged particle beam apparatus according to a second illustrative embodiment of the invention.

A control device 21 performs irradiation with the electron beam prior to performing various processes on the sample S by irradiating with the focused ion beam. Thus, as illustrated in FIG. 4, first, the control device 21 drives the stage 12 to be tilted by the tilt mechanism 13*b* of the driving mechanism 13 (step S21). The control device 21 sets the surface (that is, surface of the sample S) of the stage 12 to be orthogonal to the optical axis of the electron beam column 15 by rotating the stage 12 around the X axis or the Y axis by the tilt mechanism 13*b*.

Next, the control device 21 performs positioning of the irradiation region using the alignment mark present on the surface of the sample S (step S22). The control device 21 obtains the image data indicating the position distribution of the secondary charged particle R emitted from the sample S by irradiating the sample S on the stage 12 with the electron beam while scanning the irradiation position. The control device 21 recognizes an image of the alignment mark present on the surface of the sample S using the obtained image data and performs positioning of the irradiation region using the recognized alignment mark. The control device 21 may use a mark such as an appropriate hole formed in advance on the surface of the sample S by irradiating with the focused ion beam or the electron beam, or may use an appropriate mark and the like present on the surface of the sample S as the alignment mark.

Next, the control device 21 recognizes the position of the processing object by performing pattern matching in the image data (step S23). The control device 21 performs pattern matching using a matching pattern that is set in advance in the image data generated by irradiating with the electron beam with respect to the sample S. The control device 21 recognizes a position of a processing object using a relative positional relationship between the matching pattern and the processing object that is known. The control device 21 sets the matching pattern in a region including, for example, a predetermined reference mark and the like.

Next, the control device 21 performs positioning of the irradiation region by moving the position of the processing object B to the center of the visual field to set a processing frame (irradiation frame) for forming the deposition film at a predetermined processing position (for example, the center (the center of the visual field) of a region of the visual field and the like) (step S24). The control device 21 moves the position of the processing object to the center of the visual field by driving the stage 12 by the driving mechanism 13 and deflecting the electron beam by the electron optical system 15*b* of the electron beam column 15. Otherwise, if the position of the processing object is moved to the center of the visual field by deflection of the electron beam by the electron optical system 15*b* of the electron beam column 15 without driving the stage 12, since influence of drift due to driving of the stage is not received, it is preferable.

Next, the control device 21 sets a predetermined irradiation frame for forming the deposition film at the center of the visual field and forms a deposition film D by supplying gas by the gas supplying device 17 while irradiating the irradiation frame with the electron beam (step S25).

Next, the control device 21 drives the stage 12 to be tilted by the tilt mechanism 13b of the driving mechanism 13 (step S26). The control device 21 sets the surface (that is, the surface of the sample S) of the stage 12 to be orthogonal to the optical axis of the focused ion beam column 14 by rotating the stage 12 around the X axis or the Y axis by the tilt mechanism 13b.

Next, the control device 21 performs positioning of the irradiation region using offset information that is set in advance (step S27). The control device 21 stores information regarding position deviation of the irradiation region due to tilt driving of the stage 12 when migrating from a state of irradiating with the electron beam to a state of irradiating with the focused ion beam as the offset information in advance. The control device 21 sets, for example, a certain deviation amount in an entire region on the surface (that is, the surface of the sample S) of the stage 12 as the offset information. The control device 21 performs positioning with respect to the irradiation region in which positioning is performed using the alignment mark in step S22 described above using the offset information.

Next, the control device 21 recognizes the position of the processing object by performing a first pattern matching in the image data (step S28). The control device 21 obtains the image data (image data of low the magnification) of less than a predetermined magnification indicating the position distribution of the secondary charged particle R emitted from the sample S by irradiating the sample S on the stage 12 with the focused ion beam while scanning the irradiation position. The control device 21 recognizes the image of a predetermined first matching pattern in the image data of less than the predetermined magnification by the focused ion beam and recognizes the position of the processing object on which the deposition film D is formed using the relative positional relationship between the first matching pattern and the processing object that is known.

Next, the control device 21 performs positioning of the irradiation region by moving the position of the processing object on which the deposition film D is formed to a predetermined processing position (for example, the center of the visual field and the like) (step S29). In other words, after performing the first pattern matching in the image data, the control device 21 performs centering including positioning the irradiation region at the center of the visual field. In performing the centering, the control device 21 moves the position of the processing object to the center of the visual field by driving the stage 12 by the driving mechanism 13 and deflecting the focused ion beam by the ion optical system 14b of the focused ion beam column 14. Otherwise, if the position of the processing object is moved to the center of the visual field by deflection of the focused ion beam by the ion optical system 14b of the focused ion beam column 14 without driving the stage 12, since influence of drift due to driving of the stage is not received, it is more preferable.

Next, the control device 21 recognizes the position of the processing object by performing a second pattern matching in the image data of the magnification higher than that of the first pattern matching described above (step S30). The control device 21 obtains the image data (the image data of high magnification) of a predetermined magnification or more indicating the position distribution of the secondary charged particle R emitted from the sample S by irradiating the sample S on the stage 12 with the focused ion beam while scanning the irradiation position. The control device 21 recognizes a predetermined second matching pattern different from the first matching pattern in the image data of a predetermined magnification or more by the focused ion beam and recognizes the position of the processing object on which the deposition film D is formed using the relative positional relationship between the second matching pattern and the processing object that is known.

Next, the control device 21 performs positioning of the irradiation region by moving the position of the processing object on which the deposition film D is formed to a predetermined processing position (for example, the center of the visual field and the like) (step S31). The control device 21 moves the position of the processing object to the center of the visual field by driving the stage 12 by the driving mechanism 13 and deflecting the focused ion beam by the ion optical system 14b of the focused ion beam column 14.

Next, the control device 21 sets a predetermined irradiation frame for etching processing at the center of the visual field and performs a predetermined etching processing by irradiating the irradiation frame with the focused ion beam (step S32). Thus, the control device 21 completes a series of processes.

As described above, according to the charged particle beam apparatus 10 of the second illustrative embodiment of the invention, positioning using the alignment mark in the image data by the focused ion beam is not necessary and it is possible to simplify the positioning operation by using the offset information regarding position deviation of the irradiation region due to driving of the stage 12.

Furthermore, it is possible to set the irradiation frame considering the position deviation of the irradiation region due to driving of the stage 12 by keeping the offset information in advance in the irradiation frame used for irradiation with the focused ion beam without having to use the alignment mark.

Furthermore, in the image data of less than a predetermined magnification by the focused ion beam, it is possible to eliminate an error of the offset information and to improve the positioning accuracy of the irradiation region by performing pattern matching. Furthermore, in the image data of the predetermined magnification or more by the ion beam, it is possible to improve local positioning accuracy by performing positioning of the irradiation region using another matching pattern (that is, matching pattern at higher magnification) different from the matching pattern of the low magnification less than the predetermined magnification.

Furthermore, it is possible to protect the processing object of the irradiation region in advance by forming the deposition film in the irradiation region by irradiating with the electron beam prior to irradiating the processing object of the irradiation region with the focused ion beam.

Furthermore, whenever grasping the relative positional relationship between the position of the processing object and the processing position (for example, the center of the visual field) using the matching pattern, it is possible to improve the processing accuracy by irradiating with the focused ion beam by moving the position of the processing object to the center of the visual field by driving the stage 12. Furthermore, it is possible to perform positioning in micron order by driving of the stage 12. Furthermore, it is possible to perform positioning in nanometer order by the beam shift of the ion beam and to improve the positioning accuracy.

Furthermore, in positioning by the electron beam, since positioning of the irradiation region using matching pattern is performed after positioning of the irradiation region using the alignment mark, it is possible to improve the positioning accuracy.

Furthermore, even if the resolution of the focused ion beam is low compared to another focused ion beam column as the focused ion beam column 14 including a plasma type ion source, it is possible to ensure a desired accuracy by positioning using the alignment mark by the electron beam. That is, even if it is difficult to perform positioning using the alignment mark by the focused ion beam, it is possible to accurately perform positioning using the alignment mark by the electron beam. Furthermore, even if the focused ion beam column 14 including the plasma type ion source having a large irradiation beam current is used, it is possible to reduce damage of the sample S when setting the processing region.

Hereinafter, a first modification example of the second illustrative embodiment described above will be described.

In the second illustrative embodiment described above, if a plurality of processing objects are present, the control device 21 may execute the operations in step S26 and the following steps after the operations of step S21 to step S25 are executed with respect to one of the plurality of processing objects. In this case, the control device 21 repeatedly performs positioning using the alignment mark in the image data by the focused ion beam and positioning using the offset information in the image data by the electron beam on each of the plurality of processing objects. Thus, even if the information of the relative position with respect to the irradiation regions of processes of each other is not known, the control device 21 can accurately perform positioning.

Furthermore, the control device 21 may execute the operations in step S26 and the following steps after the operations of step S21 to step S25 described above are executed with respect to an entirety of the plurality of processing objects. In this case, the control device 21 performs only once each of positioning using the offset information in the image data by the electron beam and positioning using the alignment mark in the image data by the focused ion beam. Thus, the control device 21 can reduce an entire operation time compared to a case where driving of the stage 12 and positioning are performed for each of the plurality of processes of the electron beam and the focused ion beam.

Hereinafter, a second modification example of the second illustrative embodiment described above will be described.

In the second illustrative embodiment described above, the control device 21 performs the first and second pattern matching using two image data having different magnifications, but the invention is not limited to the illustrative embodiment.

The control device 21 may perform three pattern matchings or more using three image data or more having different magnifications. When performing pattern matching in each piece of image data of a plurality of different magnifications, the control device 21 performs positioning of the irradiation region using the different matching pattern while sequentially increasing the magnification of the image data.

Thus, the control device 21 performs positioning of the irradiation region using the plurality of other matching patterns different from the matching pattern of less than a predetermined magnification in the image data of the plurality of different magnifications by the focused ion beam and thereby it is possible to improve the positioning accuracy. Furthermore, positioning of the irradiation region using a different matching pattern in each piece of the image data while sequentially increasing the magnifications of the plurality of image data, and thereby it is possible to improve workability of the pattern matching and to easily increase the positioning accuracy of the irradiation region.

Hereinafter, a third modification example of the second illustrative embodiment described above will be described.

In the second illustrative embodiment described above, the control device 21 uses the different matching patterns in two image data having different magnifications, but the invention is not limited to the illustrative embodiment.

When performing the pattern matching in each piece of image data having the plurality of different magnifications, the control device 21 may use a common matching pattern. The control device 21 can improve recognition accuracy by sequentially increasing the magnification of the plurality of image data even if the matching pattern is not changed.

Hereinafter, another modification example (fourth modification example) of the first illustrative embodiment and the second illustrative embodiment described above will be described.

In the first illustrative embodiment and the second illustrative embodiment described above, the control device 21 forms the deposition film in the processing object of the center of the visual field by irradiating with the electron beam to protect the processing object prior to irradiating with the focused ion beam, but the invention is not limited to the illustrative embodiment.

Figure 5:
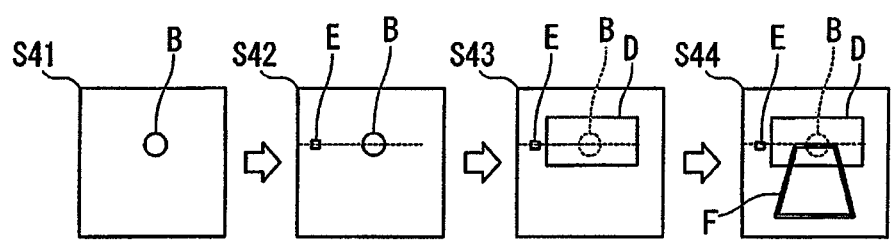
FIG. 5 is a diagram illustrating a flow of an operation of a charged particle beam apparatus according to a fourth modification example of the first illustrative embodiment and the second illustrative embodiment of the invention.

The control device 21 may form the deposition film as the reference mark used for positioning of the irradiation region in addition to the deposition film for protecting the processing object. First, as illustrated in FIG. 5, in the image data generated by irradiating with the electron beam, the control device 21 recognizes the alignment mark and recognizes the position of the processing object B by the processing of the pattern matching (step S41).

Next, the control device 21 forms a deposition film E as a reference mark at a position that is the same position in a predetermined first direction (for example, the Y axis direction or the X axis direction) and is different position in a second direction (for example, the X axis direction or the Y axis direction) orthogonal to the first direction with respect to the position of the processing object B (step S42). The control device 21 forms the deposition film E used for positioning of the irradiation region by supplying gas by the gas supplying device 17 with respect to the irradiation region including the position of the processing object B, while irradiating a predetermined region other than the irradiation region within a visual field region over a predetermined time. The control device 21 stores the relative positional relationship between the position of the deposition film E and the position of the processing object B. The control device 21 makes the predetermined time when the deposition film E is formed be a time (for example, several seconds and the like) when drift of the electron beam with respect to a desired position accuracy required for positioning of the irradiation region is negligible. Since formation of the deposition film by the electron beam takes time more than formation of the deposition film by the focused ion beam, if the deposition film is formed extensively, it takes time for the processing and it is not possible to form the deposition film at an accurate position due to receiving influence of drift. Since the deposition film E as the reference mark can be formed briefly with a short period of time, it is possible to increase the positioning accuracy.

Next, the control device 21 forms the deposition film D by supplying gas by the gas supplying device 17 while irradiating the irradiation region including the position of the processing object B with the electron beam (step S43).

Next, the control device 21 recognizes the deposition film E as the reference mark in the image data generated by irradiating with the focused ion beam and performs positioning of the irradiation region using the relative positional relationship between the deposition film E and the processing object B that is known. The control device 21 sets a predetermined irradiation frame F for etching processing at the position of the processing object B and performs a predetermined etching processing by irradiating with the focused ion beam based on the position of the processing object B recognized through the position of the deposition film E (step S44). Then, the control device 21 completes a series of processes.

According to the fourth modification example, even if the processing object B is coated with the deposition film D so as to be protected, it is possible to ensure the processing accuracy by irradiating with the focused ion beam. Furthermore, it is possible to ensure a desired positioning accuracy by making the time when the deposition film E is formed by irradiating with the electron beam be within a predetermined time in which drift of the electron beam is negligible.

Incidentally, in the fourth modification example, the control device 21 may make the deposition film E as the reference mark be in a shape (for example, a linear sheet, a rectangular shape having a predetermined width, and the like) extending in the second direction. In this case, it is possible to improve the position accuracy in the first direction (for example, the X axis direction or the Y axis direction). For example, if a thin sample for transmission observation by the transmission electron microscope from the sample S is formed, it is possible to improve the processing accuracy of the thin sample by matching a direction in which the thin sample becomes thinned to the first direction.

Furthermore, in the fourth modification example, the control device 21 may perform positioning the position of the processing object B at the center of the visual field. In this case, even if the accuracy of the magnification of the image data generated by each of the electron beam and the focused ion beam is deteriorated depending on a distance from the center position, it is possible to suppress the deterioration of the position accuracy.

Incidentally, in the fourth modification example, the control device 21 is not limited to the deposition film E as the reference mark and, for example, may form a deposition film as the matching pattern used for pattern matching.

Figure 6:
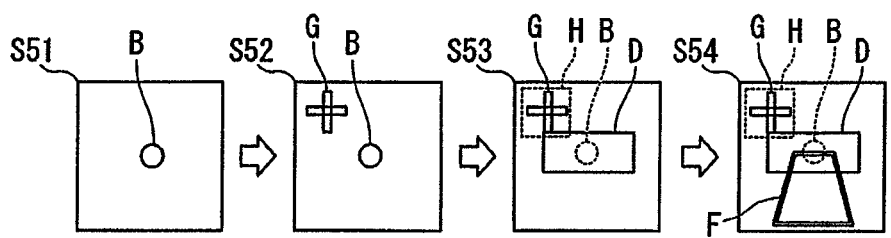
FIG. 6 is a diagram illustrating a flow of an operation of a charged particle beam apparatus according to a fifth modification example of the first illustrative embodiment and the second illustrative embodiment of the invention.

In a fifth modification example, as illustrated in FIG. 6, in the image data generated by irradiating with the electron beam, the control device 21 recognizes the alignment mark and recognizes the position of the processing object B by the processing of pattern matching (step S51).

Next, the control device 21 forms a deposition film G as the matching pattern used for pattern matching in a predetermined region other than the irradiation region within the visual field region with respect to the irradiation region including the position of the processing object B (step S52). The control device 21 stores the relative positional relationship between the position of the deposition film G and the position of the processing object B, and sets a region including the position of the deposition film G to a matching pattern H. The control device 21 makes a predetermined time when the deposition film G is formed be a time when drift of the electron beam with respect to desired position accuracy required for positioning of the irradiation region is negligible.

Next, the control device 21 forms the deposition film D by supplying gas by the gas supplying device 17 while irradiating the irradiation region including the position of the processing object B with the electron beam (step S53).

Next, the control device 21 performs pattern matching using the matching pattern H including the deposition film G in the image data generated by irradiating with the focused ion beam. The control device 21 recognizes the position of the processing object B using the relative positional relationship between the matching pattern H and the processing object B that is known. The control device 21 sets a predetermined irradiation frame F for etching processing at the position of the processing object B and performs a predetermined etching processing by irradiating with the focused ion beam (step S54). Then, the control device 21 completes a series of processes.

According to the fifth modification example, even if the processing object B is coated with the deposition film D so as to be protected, it is possible to ensure the processing accuracy by irradiating with the focused ion beam. Furthermore, it is possible to ensure a desired positioning accuracy by making the time when the deposition film G is formed by irradiating with the electron beam be within a predetermined time in which drift of the electron beam is negligible.

In the fifth modification example, the control device 21 can improve the position accuracy in the first direction and the second direction (for example, the X axis direction and the Y axis direction) by making the deposition film G as the matching pattern H be in a shape (for example, a cross shape and the like) extending in the first direction and the second direction.

Furthermore, in the fifth modification example, the control device 21 may perform positioning the position of the processing object B at the center of the visual field. In this case, even if the accuracy of the magnification of the image data generated by each of the electron beam and the focused ion beam is deteriorated depending on the distance from the center position, it is possible to suppress the deterioration of the position accuracy.

Hereinafter, another modification example (sixth modification example) of the first illustrative embodiment and the second illustrative embodiment described above will be described.

In the first illustrative embodiment and the second illustrative embodiment described above, in the image data generated by irradiating with the electron beam, the control device 21 recognizes the alignment mark and recognizes the position of the processing object by the processing of the pattern matching, but the invention is not limited to the illustrative embodiment.

The control device 21 recognizes the target object on the inside of the sample S with the electron beam having a long penetration length by increasing energy of the electron beam to a predetermined energy or more and may form the deposition film E (or the deposition film G) for positioning on the surface of the sample S based on the position of the target object.

Figure 7:
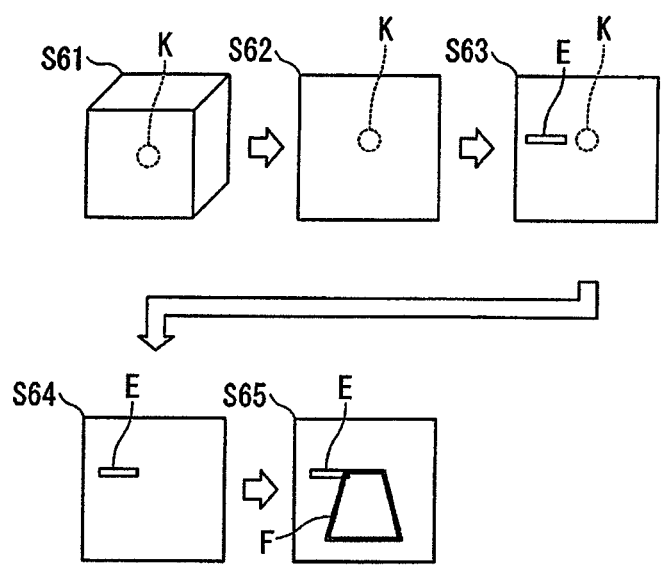
FIG. 7 is a diagram illustrating a flow of an operation of a charged particle beam apparatus according to a sixth modification example of the first illustrative embodiment and the second illustrative embodiment of the invention.

First, as illustrated in FIG. 7, the control device 21 recognizes a target object K on the inside of the sample S in the image data generated by irradiating with the electron beam of a predetermined energy or more (for example, 10 keV and the like) (step S61 and step S62).

Next, the control device 21 forms the deposition film E in which at least a direction parallel to a cross section on an extension line of a cross section is a longitudinal direction as the reference mark in a case where one side of the irradiation frame for etching processing by irradiating with the focused ion beam corresponds to a cross section that is formed by processing on the surface of the sample S with respect to the position of the target object K on the inside of the sample S (step S63). The control device 21 forms the deposition film E by supplying gas by the gas supplying device 17 while irradiating a predetermined region other than the irradiation region within the visual field region over a predetermined time. The control device 21 stores the relative positional relationship between the position of the deposition film E and the position of the processing object B. The control device 21 stores the relative positional relationship between the position of the deposition film E and the position of the target object. The control device 21 makes a predetermined time when the deposition film E is formed be a time when drift of the electron beam with respect to desired position accuracy required for positioning of the irradiation region is negligible.

Next, the control device 21 recognizes the image of the deposition film E as the reference mark in the image data generated by irradiating with the focused ion beam and performs positioning of the irradiation region using the relative positional relationship between the deposition film E and the target object that is known (step S64).

Next, the control device 21 sets a predetermined irradiation frame F for etching processing and performs a predetermined etching processing by irradiating with the focused ion beam based on the position of the target object recognized through the position of the deposition film E (step S65). Then, the control device 21 completes a series of processes.

According to the sixth modification example, even if an appropriate mark or pattern is not present on the surface of the sample S, if desired position accuracy cannot be ensured in the mark or pattern on the surface of the sample S, it is possible to ensure a desired positioning accuracy. Furthermore, since the mark is formed on the extension line of the cross section, it is possible to accurately set the position of the cross section.

Incidentally, in the sixth modification example, the control device 21 is not limited to the deposition film E as the reference mark and, for example, may form a deposition film G as the matching pattern used for pattern matching.

Hereinafter, another modification example (seventh modification example) of the first illustrative embodiment and the second illustrative embodiment described above will be described.

In the fifth modification example of the first illustrative embodiment and the second illustrative embodiment described above, the control device 21 forms the deposition film G as the matching pattern in a predetermined region other than the irradiation region within the visual field region with respect to the irradiation region including the position of the processing object B, but the invention is not limited to the illustrative embodiment.

The control device 21 may set a common matching pattern in each of the electron beam and the focused ion beam in the irradiation region including the processing object B in a state before various deposition films are formed by irradiating with the electron beam. Even if the deposition film is formed in the irradiation region by irradiating with the electron beam, the control device 21 can ensure a desired matching accuracy in the pattern matching with respect to the image data of the focused ion beam. Thus, it is possible to improve operation efficiency compared to a case where a new matching pattern is used when irradiating with the focused ion beam.

Hereinafter, another modification example (eighth modification example) of the first illustrative embodiment and the second illustrative embodiment described above will be described.

In the first illustrative embodiment and the second illustrative embodiment described above, the control device 21 may notify switching to a manual mode by display, sound, and the like if the target object cannot be automatically recognized in the image data by the electron beam. The control device 21 displays that the reference mark or the matching pattern is set by a manual operation of an operator in the manual mode.

Incidentally, in the illustrative embodiment described above, the control device 21 may be a software function section or hardware such as an LSI.

Incidentally, the above-described illustrative embodiments are those presented as examples and are not intended to limit the scope of the invention. These novel illustrative embodiments may be implemented in various other forms and it is possible to make various omissions, substitutions, and changes without departing from the scope of the invention. These illustrative embodiments and variations thereof are included in the scope and spirit of the invention and are includes in the scope of equivalents thereof as set forth in the appended claims.

What is claimed is:
1. A charged particle beam apparatus comprising:
a stage for fixing a sample;
a driving device configured to drive the stage;
an ion beam column configured to irradiate the sample with an ion beam;
an electron beam column configured to irradiate the sample with an electron beam;
a detector configured to detect secondary particles emitted from the sample irradiated with the ion beam or the electron beam;
a gas supplying device configured to supply gas for forming a deposition film on a surface of the sample; and
a control device configured to:
control the electron beam column to irradiate the sample with the electron beam;
convert a first detection amount of the secondary particles detected by the detector into a first brightness signal by irradiating the sample with the electron beam;
generate first image data based on the first brightness signal, the first image data indicating a first position distribution of the secondary particles detected by the detector;
recognize an alignment mark provided in the first image data,
perform positioning of an irradiation region of the sample with respect to the electron beam using the alignment mark recognized in the first image data;
determine a relative positional relationship between the alignment mark recognized in the first image data and the irradiation region of the sample;
control the ion beam column to irradiate the sample with the ion beam;
convert a second detection amount of the secondary particles detected by the detector into a second brightness signal by irradiating the sample with the ion beam;
generate second image data based on the second brightness signal, the second image data indicating a second position distribution of the secondary particles detected by the detector;
recognize the alignment mark provided in the sample in the second image data; and
perform positioning of the irradiation region of the sample with respect to the ion beam using the alignment mark recognized in the second image data and the relative positional relationship.

2. The charged particle beam apparatus according to claim 1,
wherein when irradiating the sample with the electron beam, the control device is configured to:
drive the stage so as to be orthogonal to an optical axis of the electron beam column;
recognize the alignment mark in the image data by the electron beam; and
perform positioning of the irradiation region using the alignment mark, and
wherein when irradiating the sample with the ion beam, the control device is configured to:
drive the stage so as to be orthogonal to an optical axis of the ion beam column;
recognize the alignment mark in the image data by the ion beam; and
perform positioning of the irradiation region using the alignment mark.

3. The charged particle beam apparatus according to claim 2,
wherein when irradiating the sample with the electron beam, the control device, after performing positioning of the irradiation region using the alignment mark, is configured to:
recognize a first matching pattern in the image data by the electron beam; and
perform positioning of the irradiation region using the first matching pattern, and
wherein when irradiating the stage with the ion beam, the control device, after performing positioning of the irradiation region using the alignment mark, is configured to:
recognize a second matching pattern in the image data by the ion beam; and
perform positioning of the irradiation region using the second matching pattern.

4. The charged particle beam apparatus according to claim 3, wherein the control device is configured to make the first matching pattern and the second matching pattern be the same pattern.

5. The charged particle beam apparatus according to claim 2, wherein the control device is configured to perform each of positioning using the alignment mark in the image data by the electron beam and positioning using the alignment mark in the image data by the ion beam with respect to a plurality of the irradiation regions only once.

6. The charged particle beam apparatus according to claim 2, wherein the control device is configured to perform positioning using the alignment mark in the image data by the electron beam and positioning using the alignment mark in the image data by the ion beam with respect to each of a plurality of the irradiation regions repeatedly.

7. The charged particle beam apparatus according to claim 2, wherein the control device is configured to:
set irradiation frames of the electron beam and the ion beam using the image data by the electron beam; and
use the irradiation frames in each of a case where the sample is irradiated with the electron beam and a case where the sample is irradiated with the ion beam.

8. A charged particle beam apparatus comprising:
a stage for fixing a sample;
a driving device configured to drive the stage;
an ion beam column configured to irradiate the sample with an ion beam;
an electron beam column configured to irradiate the sample with an electron beam;
a detector configured to detect secondary particles emitted from the sample irradiated with the ion beam or the electron beam;
an image data generator configured to generate image data indicating the position distribution of the secondary particles detected by the detector;
a gas supplying device configured to supply gas for forming a deposition film on a surface of the sample; and
a control device configured to:
control the electron beam column to irradiate the sample with the electron beam prior to irradiating the sample with the ion beam;
recognize an alignment mark provided in the sample in the image data by the electron beam; and
perform positioning of an irradiation region of the sample using the alignment mark;
wherein when irradiating the sample with the electron beam, the control device is configured to:
drive the stage so as to be orthogonal to an optical axis of the electron beam column;
recognize the alignment mark in the image data by the electron beam; and
perform positioning of the irradiation region using the alignment mark; and
wherein when irradiating the sample with the ion beam, the control device is configured to:
drive the stage so as to be orthogonal to an optical axis of the ion beam column;
recognize a first matching pattern in the image data of a first magnification by the ion beam using offset information on position deviation of the irradiation region in accordance with driving of the stage when transition from a state of irradiating with the electron beam to a state of irradiating with the ion beam is performed, the first magnification being less than a predetermined magnification; and
perform positioning of the irradiation region using the first matching pattern.

9. The charged particle beam apparatus according to claim 8, wherein when irradiating the sample with the ion beam, the control device, after performing positioning of the irradiation region using the first matching pattern, is configured to:
recognize a second matching pattern, which is different from the first matching pattern, in the image data of a second magnification by the ion beam, the second magnification being equal to or more than the predetermined magnification; and
perform positioning of the irradiation region using the second matching pattern.

10. The charged particle beam apparatus according to claim 8, wherein when irradiating the sample with the ion beam, the control device, after performing positioning of the irradiation region using the first matching pattern, is configured to:
recognize a plurality of other matching patterns different from the first matching pattern in each type of the image data of a plurality of different magnifications by the ion beam; and perform positioning of the irradiation region using each of the plurality of other matching patterns.

11. The charged particle beam apparatus according to claim 10, wherein the control device is configured to perform positioning of the irradiation region using each of the plurality of other matching patterns while sequentially increasing the magnification of the image data of the plurality of different magnifications.

12. The charged particle beam apparatus according to claim 8, wherein when irradiating the sample with the electron beam, the control device, after performing positioning of the irradiation region using the alignment mark, is configured to:
recognize the matching patterns in the image data by the electron beam; and
perform positioning of the irradiation region using the matching pattern.

13. The charged particle beam apparatus according to claim 8, wherein the ion beam column comprises a plasma type ion source.

14. The charged particle beam apparatus according to claim 8, wherein the control device is configured to form the deposition film in the irradiation region by irradiating the irradiation region with the electron beam while supplying the gas to the irradiation region prior to irradiating the irradiation region with the ion beam.

15. The charged particle beam apparatus according to claim 14,
wherein the control device is configured to:
form the deposition film in a predetermined region by irradiating the predetermined region with the electron beam while supplying the gas to the predetermined region other than the irradiation region; and
make a region including the deposition film formed in the predetermined region be a reference mark or a matching pattern, and
wherein in each of a case where the irradiation region is irradiated with the electron beam and a case where the irradiation region is irradiated with the ion beam, the control device is configured to:
recognize the reference mark or the matching pattern in the image data by each of the electron beam and the ion beam; and
perform positioning of the irradiation region using the reference mark or the matching pattern.

16. The charged particle beam apparatus according to claim 15, wherein the control device is configured to complete formation of the deposition film within a predetermined time when forming the deposition film in the predetermined region.

17. The charged particle beam apparatus according to claim 15, wherein the control device is configured to make a shape of the deposition film formed in the predetermined region be a shape extending on an extension line of a cross section formed by processing the ion beam.

18. The charged particle beam apparatus according to claim 14,
wherein the control device is configured to make a region including the irradiation region be the matching pattern, and
wherein in each of a case where the irradiation region is irradiated with the electron beam and a case where the irradiation region is irradiated with the ion beam, the control device is configured to:
recognize the matching pattern in the image data by each of the electron beam and the ion beam; and
perform positioning of the irradiation region using the matching pattern.

19. The charged particle beam apparatus according to claim 14, wherein the control device is configured to:
recognize a target object in the image data on an inside of the sample by the electron beam; and
form the deposition film on the surface of the sample using the target object.

20. The charged particle beam apparatus according to claim 14, wherein the control device is configured to notify switching to a manual mode when it is unable to recognize the target object in the image data by the electron beam automatically.

21. A charged particle beam apparatus comprising:
a stage for fixing a sample;
a driving device configured to drive the stage;
an ion beam column configured to irradiate the sample with an ion beam;
an electron beam column configured to irradiate the sample with an electron beam;
a detector configured to detect secondary particles emitted from the sample irradiated with the ion beam or the electron beam;
an image data generator configured to generate image data indicating the position distribution of the secondary particles detected by the detector;
a gas supplying device configured to supply gas for forming a deposition film on a surface of the sample; and
a control device configured to:
control the electron beam column to irradiate the sample with the electron beam prior to irradiating the sample with the ion beam;
recognize an alignment mark provided in the sample in the image data by the electron beam; and
perform positioning of an irradiation region of the sample using the alignment mark;
wherein when irradiating the sample with the ion beam, the control device is configured to:
recognize a first matching pattern in the image data by the ion beam using offset information on position deviation of the irradiation region in accordance with driving of the stage when transition from a state of irradiating with the electron beam to a state of irradiating with the ion beam is performed; and
perform positioning of the irradiation region using the first matching pattern.

* * * * *